United States Patent [19]

Reimer

[11] Patent Number: 4,505,394
[45] Date of Patent: Mar. 19, 1985

[54] ELECTRICAL APPARATUS FRAME

[75] Inventor: William A. Reimer, Wheaton, Ill.

[73] Assignee: GTE Automatic Electric Inc., Northlake, Ill.

[21] Appl. No.: 431,907

[22] Filed: Sep. 30, 1982

[51] Int. Cl.³ .............................................. A47G 19/08
[52] U.S. Cl. ..................................... 211/41; 211/150; 108/5; 312/323; 361/415
[58] Field of Search ................. 211/41, 150, 134, 187, 211/133; 108/5, 102; 361/415; 312/323, 132, 322; 108/6, 117, 5

[56] References Cited

U.S. PATENT DOCUMENTS

| 631,312 | 8/1899 | Macey | 312/323 X |
| 2,423,919 | 7/1947 | Wolters | 312/323 |
| 4,314,734 | 2/1982 | Grunert | 312/323 X |

Primary Examiner—Ramon S. Britts
Assistant Examiner—Blair M. Johnson
Attorney, Agent, or Firm—Robert J. Black; Gregory G. Hendricks

[57] ABSTRACT

An electrical apparatus frame mounting a number of electrical assemblies. Access to said electrical assemblies is provided for maintenance purposes, while the assemblies are in operation. Access is provided by a slide out and hinge down arrangement. The electrical assemblies rest on support guides which may be inclined at an angle to the horizontal to provide convection cooling.

8 Claims, 3 Drawing Figures

FIG. I

ELECTRICAL APPARATUS FRAME

BACKGROUND OF THE INVENTION

1. Field of the Invention

The present invention relates to equipment frames and more particularly to an electrical equipment frame providing access to electrical component assemblies arranged for natural convection cooling by a slide out and hinge down arrangement.

2. Background Art

Electrical equipment frames are well known to those skilled in the art. U.S. Pat. No. 3,730,264 issued May 1, 1973, to Krylow, et al., teaches a heat exchanger for use with electronic circuitry mounted in frames. Cooling of the electronic circuitry is effected by mounting the circuitry on cards within card files which are positioned in a frame between V-shaped air deflecting plates. Cooling air enters the frame below each card file near its center and travels upward past each card, cooling components mounted thereon. The air then continues out the top of the card file and is deflected toward the ends of the card file by the V-shaped air deflecting plate. While operating generally satisfactorily, this system requires the allocation of space between each card file for use as air inlet and exhaust ducts thereby reducing the quantity of electronic circuitry which may be packaged within a frame.

German Pat. No. 1,263,119 issued Mar. 14, 1968, to Thom, et al. teaches packaging of telephone central office equipment between vertically oriented adjoining supports having, along their length, guides or resilient members arranged to accept low profile electrical or electronic assemblies. The supports or guide elements supporting a particular electronic assembly between two uprights are vertically offset so as to slant the card to the left or to the right when viewed from the front of the frame. The direction of slant is alternated in adjacent frames so as to provide intake and exhaust columns within the vertically oriented supports. Such an arrangement, while operating generally satisfactorily, requires additional engineering effort, when frames are located, to properly position the air inlet and exhaust ducts within the frame supports.

U.S. Pat. No. 3,280,377 issued Oct. 18, 1966, to Harris, et al. teaches a rack for mounting electrical apparatus on cards within card files which are inclined to the horizontal when the equipment is in use. Side panels of the rack cooperate with shelves which support the card files to form a plurality of inclined cooling ducts having the card files mounted centrally therein. Cooling air enters each card file at the back of each cooling duct, moves through each file, cools components mounted therein, and finally exhausts from the front of the card file upward. This arrangement requires the use of card relocation devices such as card extenders to diagnose circuitry operating within the frame.

SUMMARY OF THE INVENTION

The present invention relates to an electrical apparatus frame having a pair of uprights and a plurality of pairs of support guides mounted to the uprights. Each pair of support guides position a planar assembly of electrical or electronic apparatus at an angle to the horizontal inclined upward toward the front of the frame to provide convection cooling for the planar assembly. Alternatively, the support guides may be arranged to position the planar assemblies perpendicular to the frame uprights if such convection cooling is not desired. The present invention may be utilized to package electrical or electronic components in any of the commonly known ways to those skilled in the art. In this regard, the planar electronic assembly may be a single circuit card mounting discrete and/or integrated circuits thereon, or it may be a multilayer backplane assembly mounting connectors into which circuit boards or thick film hybrid substrates are plugged.

Each support guide includes on its front, an upwardly-oriented hook, positioned to engage catch recesses formed in the planar assembly edges which engage the support guides. The electronic assemblies are slid out and hinged down on the hooks to provide access to circuitry and components mounted thereon for maintenance purposes while such circuitry remains in operation. In its hinged down position, an electronic assembly which has been pulled out for maintenance purposes is positioned at a distance from the front edges of electronic assemblies mounted below it within the frame. The spaced-away positioning permits cooling air to circulate, as by convection cooling past those electronic assemblies whose fronts have been covered by the assembly undergoing maintenance. This arrangement thus prevents circuitry mounted on the covered assemblies from overheating.

DESCRIPTION OF THE PREFERRED EMBODIMENT

Figure 1:
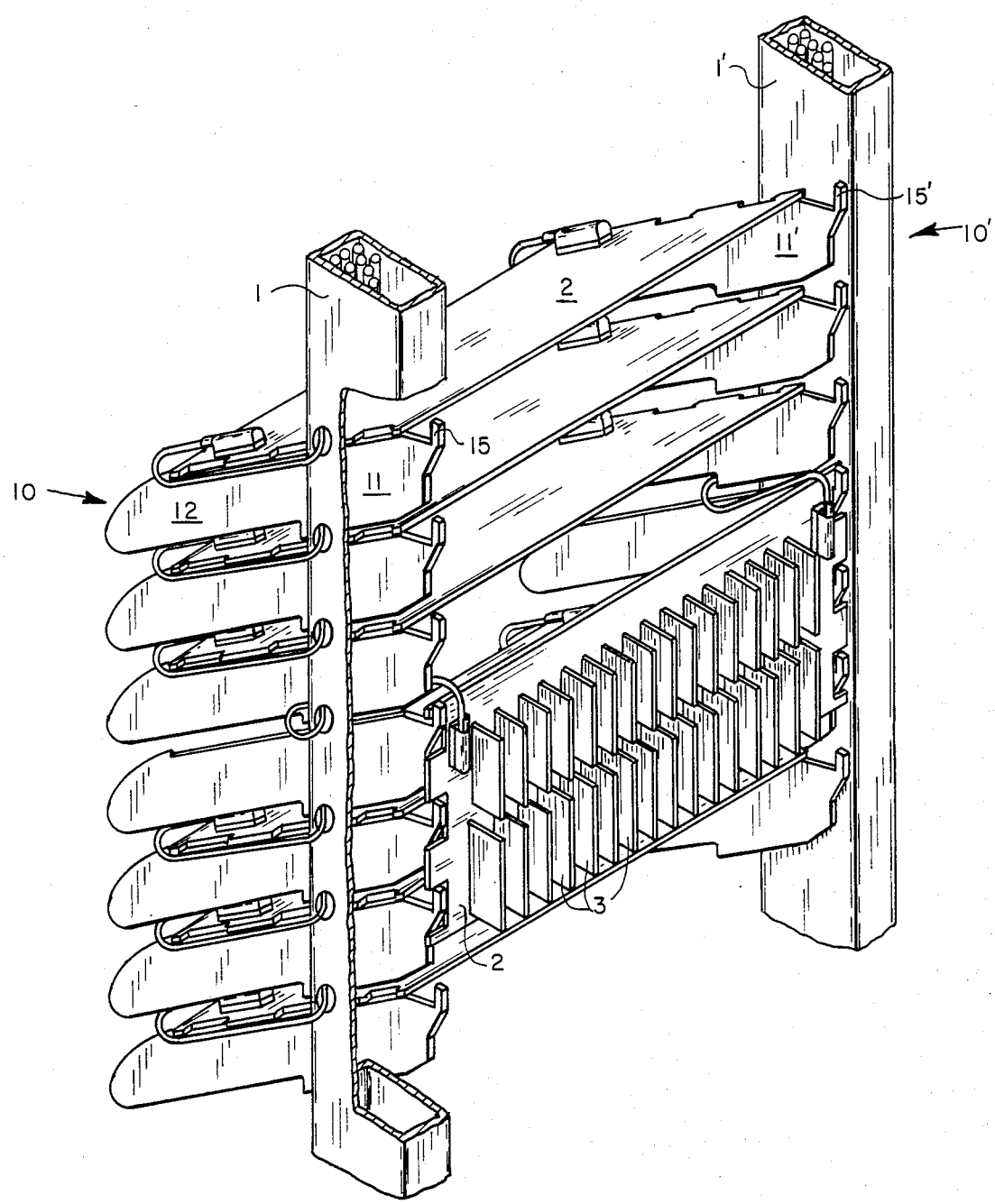
FIG. 1 shows a perspective view of the subject invention showing one planar assembly slid out and hinged down in the maintenance position.
Figure 2:
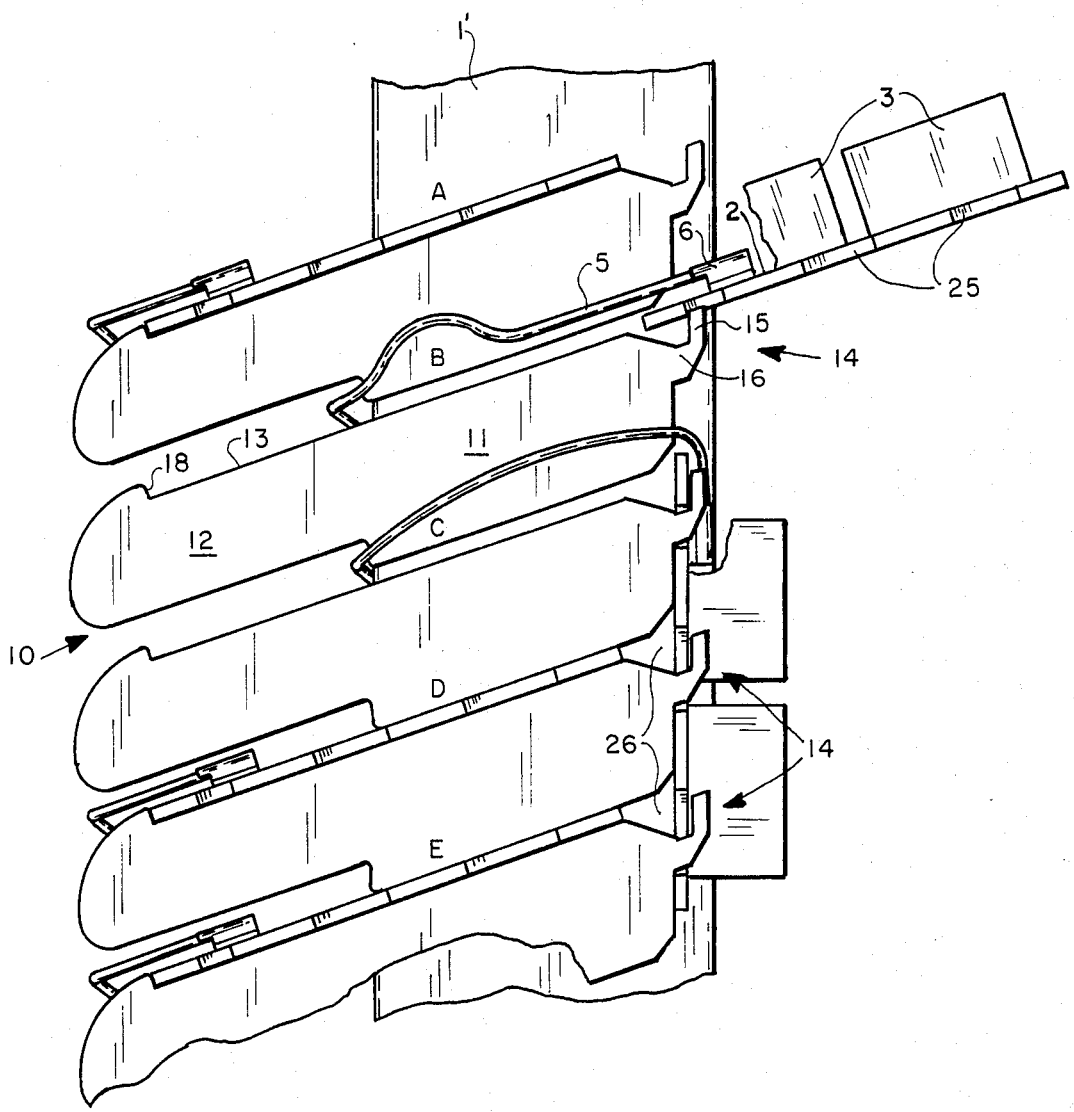
FIG. 2 shows a side elevational view of a portion of FIG. 1 to more clearly illustrate the elements of the subject invention.

Referring now to FIGS. 1 and 2, there is shown an electronic apparatus frame in accordance with the present invention. Vertically oriented frame uprights 1 and 1' are provided to support a plurality of planar electronic assemblies generally indicated by 2 each mounting electronic components or sub-assemblies generally indicated by 3. Upright 1 has been shown partly cut away to more clearly show the front portions of support guides 10. Pairs of support guides, generally indicated by 10 and 10', are mounted to uprights 1 and 1' respectively to support each planar assembly 2. Support guides 10 and 10' may be fastened to frame uprights 1 and 1' by any suitable means; for example, by the use of screw fasteners, spot welding or other techniques known to those skilled in the art. Support guides of a pair, for example support guide 10 and its pair mate 10', are mounted at the same height on uprights 1 and 1' placing them opposite each other.

Referring now to FIG. 2, there are shown a plurality of card guides generally indicated by 10 attached to upright 1 (not shown) by a suitable means such as screw fastening. Support guides 10 each include a body portion 11 to which is connected a tail portion 12 at the rear end and a hinging pivot hook portion 14 at the front end. A guide surface 13 extends along the top of support guide 10 at an angle to the horizontal sloping downward towards the rear, and terminates at guide stop 18.

The guide surface 13 is positioned at an angle to the horizontal to similarly position a planar assembly 2 mounted thereon and thereby provide convection cooling for the planar assembly. Pivot hook 14 is positioned below guide surface 13 at the front of support guide 10 and extends fowardly therefrom. The hook 14 includes base portion 16 extending forward of the front end of the support guide 10 from a point below the guide surface 13. The base portion 16 supports and positions an upwardly oriented finger portion 15 in its location the finger portion 15 extending from the base portion 16 upwardly and ending at a point just below the plane of guide surface 13.

Figure 3:
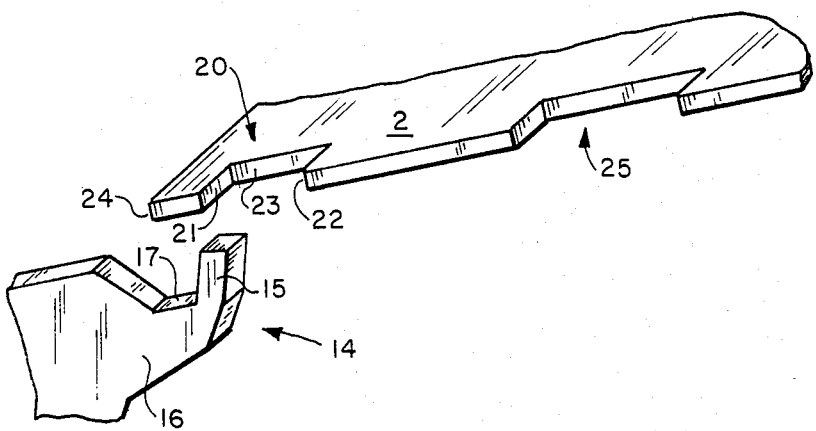
FIG. 3 details elements of the hook and catch arrangement used to support assemblies in the maintenance position.

Referring now to FIGS. 2 and 3, each planar assembly 2 includes along each of its side edges a catch recess 20 near rear edge 24, and several clearance recesses 25 spaced at intervals along each of the sides. Catch recess 20 is defined by front surface 22, rear surface 21, and inward surface 23, and is sized to fit about base 16 of hook 14 to support planar assembly 2 when it is hinged down for maintenance. In this regard, upper surface 17 of hook base 16 engages catch recess rear surface 21 to support planar assembly 2 in a vertical position.

Referring to FIG. 2, specifically the planar assembly 2 belonging to guide slot C which is hinged down for maintenance, it will be seen that clearance recesses 25 are provided in the side edges of planar assembly 2 to permit that assembly to pass the pivot hooks 14 of subtending support guides 10 when the planar assembly 2 of guide slot C is hinged down for maintenance. Stop 18 is positioned at an appropriate distance from hook base upper surface 17 to create clearance area 26 between the front edge of an in-place planar assembly 2 (as shown in guide slots D and E) and the back surface of a planar assembly 2 hinged down for maintenance (as shown hinged down from guide slot B). Clearance area 26 provides an opening through which convection cooling exhaust air may pass for planar assemblies 2 in guide slots D and E which are covered by planar assembly 2 from guide slot B which is hinged down for maintenance.

A planar assembly 2 of the subject invention is repositioned for maintenance while still remaining operational by sliding it forward and upward along guide surface 13 and outward until catch recess rear surface 21 is approximately above hook base upper surface 17 (see planar assembly 2 associated with guide slot B). The front edge of planar assembly 2 is then pivoted downwardly about catch recess rear surface 21 acting against base upper hook surface 17. Clearance recesses 25 on either side of the planar assembly 2 permit hooks 14 of below-mounted support guides 10 to pass through the edges of support plane 2 as it approaches a vertical orientation thereby allowing it to attain a vertical orientation unobstructed (see planar assembly 2 associated with guide slot C).

While being repositioned and in its maintenance position, circuitry mounted on the planar assembly 2 remains connected and operational by virtue of cable 5 terminated in connector 6. In this regard, cable 5 flexes and in cooperation with connector 6 provides for the access and egress of signals and power to the planar assembly 2 being positioned for maintenance.

Planar assembly 2 may be replaced, according to the present invention, by moving the assembly from its in-service position to its maintenance position, disconnecting its cables 5, at connector 6, and lifting the assembly off of and away from the hooks 14 and 14' (not shown) supporting it. A replacement assembly is then positioned on the support hooks 14 and 14', and the cable connectors 6 are reconnected thereby activating the replacement assembly. The replacement assembly may then be moved to its in-service position by hinging it up on support hooks 14 and 14' and finally sliding it back into position along its support guides 10 and 10' (not shown) until planar assembly rear edge 24 contacts stops 18 and 18' (not shown).

The present invention has been described with reference to a specific embodiment thereof for the purpose of illustrating the manner in which the invention may be used to advantage. It will be appreciated by those skilled in the art that numerous modifications of the present invention can be made without departing from the spirit of the invention which shall be limited only by the scope of the claims appended hereto.

What is claimed is:

1. An electrical apparatus frame, comprising:
    first and second vertical frame uprights parallel to each other;
    at least a first pair of support means having a front and rear end, a first one of said first pair of support means attached to said first upright and a second one of said first pair of support means attached to said second upright, each support means of said pair of support means including an upper guide surface oriented in an inclined position, both of said guide surfaces lying within a common support plane;
    at least one planar assembly having a front and rear edge, said support means engaging said planar assembly while permitting sliding motion thereof along said inclined guide surfaces therealong, said inclined guide surfaces positioning said planar assembly in a like inclined position to provide convection cooling thereof;
    a hook attached to each of said support means, extending from a said front end thereof, said hook positioned below said associated support plane; and
    a pair of catches formed in each said planar assembly adjacent the rear edge thereof, each catch engaging a corresponding one of said hooks when said planar assembly is slid out of engagement with said guide surfaces thereby forming a pivot axis to allow said planar assembly to pivot into a vertical plane.

2. An electrical apparatus frame as claimed in claim 1, wherein: each of said pair of support means is mounted to its associated vertical upright at the same height.

3. An electrical apparatus frame as claimed in claim 1, wherein: said support means guide surfaces are inclined upwardly in the forward direction.

4. An electrical apparatus frame as claimed in claim 3, wherein: each of said support means includes a raised stop at the rear end of said guide surface to limit rearward movement of said planar assembly.

5. An electrical apparatus frame as claimed in claim 1, wherein: said hooks each include a base portion and a finger portion, said base portion attached at a point of said support means front end below said guide surface, and said finger portion attached to said base portion, extending upwardly from said attachment point and ending at a point longitudinally in line with said upper guide surface.

6. An electrical apparatus frame as claimed in claim 5, wherein: said pair of catches comprise a pair of recesses formed in said planar assembly.

7. An electrical apparatus frame, comprising:

first and second vertical frame uprights parallel to each other;

at least a first pair of support means having a front and rear end, a first one of said first pair of support means attached to said first upright and a second one of said first pair of support means attached to said second upright opposite said first one of said support means, each support means of said first pair of support means including an upper guide surface positioned within a common support plane, each guide surface inclined upward in the forward direction and including a raised stop at the rear end thereof to limit rearward movement of said planar assembly;

at least one planar assembly having a front and rear edge, said support means engaging said planar assembly to position said planar assembly inclined upward in the forward direction while permitting sliding motion therealong, said planar assembly inclined to provide for natural convection cooling thereof;

a hook attached to each said support means and extending from a front end thereof, said protrusions each including a base portion and a finger portion, attached to said front end below said guide surface and said finger portion attached to said base portion, extending upwardly therefrom and ending at a point longitudinally aligned with said upper guide surface; and a pair of catches, each catch defined by a recess in a lateral edge adjacent the rear edge of said planar assembly, and each catch engaging a corresponding one of said pair of hooks when said planar assembly is slid out of engagement with said guide surfaces thereby forming a pivot axis to allow said planar assembly to pivot into a vertical plane.

8. An electrical apparatus frame as claimed in claim 1, wherein: said electrical apparatus frame includes at least a second pair of support means and said planar assembly includes at least one clearance recess in each lateral edge, each of said second support means positioned below a corresponding one of said first pair of support means a predetermined interval and said clearance recess located a distance forward of said catch equal to said interval, said hooks of said second support means engaged with and passing through said clearance recesses when said planar assembly is vertically supported by said catches on said hooks of said first pair of support means.

* * * * *